(12) United States Patent
Gao

(10) Patent No.: US 11,121,337 B2
(45) Date of Patent: Sep. 14, 2021

(54) OLED DISPLAY SUBSTRATE AND METHOD FOR MANUFACTURING THE SAME, DISPLAY DEVICE AND PACKAGING METHOD THEREOF

(71) Applicant: BOE TECHNOLOGY GROUP CO., LTD., Beijing (CN)

(72) Inventor: Xinwei Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 630 days.

(21) Appl. No.: 16/075,243

(22) PCT Filed: Feb. 8, 2018

(86) PCT No.: PCT/CN2018/075763
§ 371 (c)(1),
(2) Date: Aug. 3, 2018

(87) PCT Pub. No.: WO2018/210018
PCT Pub. Date: Nov. 22, 2018

(65) Prior Publication Data
US 2021/0202873 A1    Jul. 1, 2021

(30) Foreign Application Priority Data

May 17, 2017    (CN) .......................... 201710347612.1

(51) Int. Cl.
*H01L 51/50* (2006.01)
*H01L 51/52* (2006.01)
(Continued)

(52) U.S. Cl.
CPC ........ *H01L 51/5008* (2013.01); *H01L 51/004* (2013.01); *H01L 51/524* (2013.01); *H01L 51/56* (2013.01); *H01L 2251/552* (2013.01)

(58) Field of Classification Search
CPC . H01L 51/5008; H01L 51/004; H01L 51/524; H01L 51/56
See application file for complete search history.

(56) References Cited

U.S. PATENT DOCUMENTS 9,126,899 B2    9/2015  Norikane
9,464,216 B2   10/2016  Akiyama et al.
(Continued)

FOREIGN PATENT DOCUMENTS

CN    101764145 A    6/2010
CN    104093700 A   10/2014
(Continued)

OTHER PUBLICATIONS

International Search Report dated Apr. 26, 2018 issued in corresponding International Application No. PCT/CN2018/075763.
(Continued)

*Primary Examiner* — Anthony Ho
(74) *Attorney, Agent, or Firm* — Nath, Goldberg & Meyer; Joshua B. Goldberg

(57) ABSTRACT

Disclosed is a method for manufacturing an OLED display substrate, including: providing an substrate; forming a first electrode layer on the substrate; forming an initial solid buffer layer with a material including a component having an azobenzene group on the first electrode layer; liquefying the initial solid buffer layer into a liquid buffer layer by irradiating it with ultraviolet light; curing the liquid buffer layer to obtain a final solid buffer layer by irradiating it with visible light, wherein the final solid buffer layer has a HOMO energy level between −6 eV and −4.5 eV and a LUMO energy level between −3 eV and −2 eV; forming a light emitting functional layer on the final solid buffer layer; and forming a second electrode layer on the light emitting functional layer. An OLED display substrate, a method for
(Continued)

packaging a display device, and a display device are also provided.

16 Claims, 4 Drawing Sheets

(51) Int. Cl.
*H01L 51/00* (2006.01)
*H01L 51/56* (2006.01)

(56) References Cited

U.S. PATENT DOCUMENTS

2010/0156765 A1 6/2010 Park et al.
2014/0070186 A1 3/2014 Kim

FOREIGN PATENT DOCUMENTS

| CN | 104471009 A | 3/2015 |
| CN | 106450029 A | 2/2017 |
| CN | 106920902 A | 7/2017 |
| JP | 2005-56693 A | 3/2005 |
| WO | 2015/118650 A1 | 8/2015 |

OTHER PUBLICATIONS

Office Action dated Feb. 13, 2018 issued in corresponding Chinese Application No. 201710347612.1.

OLED DISPLAY SUBSTRATE AND METHOD FOR MANUFACTURING THE SAME, DISPLAY DEVICE AND PACKAGING METHOD THEREOF

This is a National Phase Application filed under 35 U.S.C. 371 as a national stage of PCT/CN2018/075763, filed Feb. 8, 2018, an application claiming the benefit of Chinese Application No. 201710347612.1, filed May 17, 2017, the content of each of which is hereby incorporated by reference in its entirety.

CROSS-REFERENCE OF RELATED APPLICATIONS

The present application claims the priority of Chinese Patent Application No. 201710347612.1 filed on May 17, 2017 in accordance with the Paris Treaty, the entire contents of which are hereby incorporated by reference.

TECHNICAL FIELD

The present disclosure relates to the field of display technology, and in particular, to a method for manufacturing an OLED display substrate, an OLED display substrate obtained by the method, a display device including the OLED display substrate; and a method for packaging a display device and a display device obtained by the method for packaging.

BACKGROUND

An OLED display device has advantages of high response speed, lightness, thinness and the like, and is more and more popular among users. The technical problem how to reduce the display defects of the OLED display device is urgently to be solved in the art.

SUMMARY

The objective of the present disclosure is to provide a method for manufacturing an OLED display substrate, an OLED display substrate obtained by the method, a display device including the OLED display substrate, a method for packaging a display device, and a display device obtained by the method. The OLED display substrate manufactured by the method according to the present disclosure has a higher yield, and the display device obtained by the method according to the present disclosure also has a higher yield.

In order to achieve the above objective, a first aspect of the present invention provides a method for manufacturing an OLED display substrate, including:
providing an substrate;
forming a first electrode layer on the substrate;
forming an initial solid buffer layer on the first electrode layer with a material including a component having an azobenzene group;
irradiating the initial solid buffer layer with ultraviolet light to liquefy the initial solid buffer layer into a liquid buffer layer;
irradiating the liquid buffer layer with visible light to cure the liquid buffer layer so as to obtain a final solid buffer layer, wherein the final solid buffer layer has a HOMO energy level between −6 eV and −4.5 eV and a LUMO energy level between −3 eV and −2 eV;
forming a light emitting functional layer on the final solid buffer layer; and
forming a second electrode layer on the light emitting functional layers.

Preferably, the material forming the initial solid buffer layer includes a component shown by the following formula:

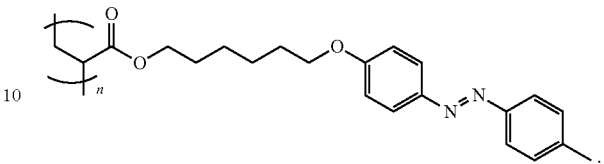

Preferably, the visible light has a wavelength of 530 nm to 550 nm.

Preferably, the ultraviolet light has a wavelength of 360 nm to 400 nm.

As a second aspect of the present invention, an OLED display substrate is provided. The OLED display substrate includes an substrate, a first electrode layer, a light emitting functional layers and a second electrode layer disposed in this order, wherein the OLED display substrate further includes a final solid buffer layer formed with a material including a component having an azobenzene group between the light emitting functional layers and the first electrode layer, and the final solid buffer layer has a HOMO energy level between −6 eV and −4.5 eV and a LUMO energy level between −3 eV and −2 eV.

Preferably, the material forming the final solid buffer layer includes a component shown by the following formula:

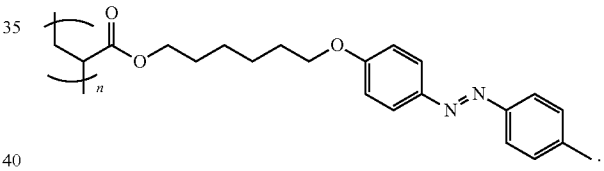

As a third aspect of the present invention, a display device is provided. The display device includes the above-mentioned OLED display substrate according to the present disclosure and a packaging cover plate.

As a fourth aspect of the present invention, a packaging method of a display device is provided, including:
providing an OLED display substrate;
forming at least one final solid organic packaging layer; and
providing a packaging cover plate on the last layer of the final solid organic packaging layer,
wherein the step of forming the final solid organic packaging layer includes:
forming an initial solid organic packaging layer with a material including a component having an azobenzene group;
irradiating the initial solid organic packaging layer with ultraviolet light to liquefy the initial solid organic packaging layer into a liquid packaging layer; and
irradiating the liquid packaging layer with visible light to cure the liquid packaging layer to obtain the final solid organic packaging layer.

Preferably, the material forming the initial solid organic packaging layer includes a component shown by the following formula:

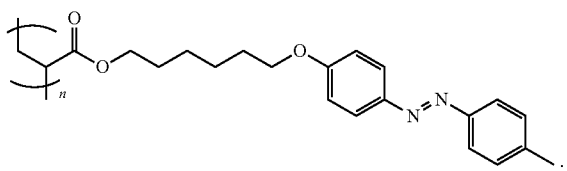

Preferably, the step of providing the OLED display substrate includes:

providing an substrate;

forming a first electrode layer on the substrate;

forming an initial solid buffer layer on the first electrode layer with a material including a component having an azobenzene group, wherein the initial solid buffer layer has a HOMO energy level between −6 eV and −4.5 eV and a LUMO energy level between −3 eV and −2 eV;

irradiating the initial solid buffer layer with ultraviolet light to liquefy the initial solid buffer layer into a liquid buffer layer, irradiating the liquid buffer layer with visible light to cure the liquid buffer layer so as to obtain a final solid buffer layer;

forming a light emitting functional layers on the final solid buffer layer; and forming a second electrode layer on the light emitting functional layers.

Preferably, the packaging method further includes the following step implemented between the step of providing the OLED display substrate and the step of forming at least one final solid organic packaging layer:

forming an inorganic packaging layer on the OLED display substrate.

Preferably, the visible light has a wavelength of 530 nm to 550 nm.

Preferably, the ultraviolet light has a wavelength of 360 nm to 400 nm.

As a fifth aspect of the present invention, a display device is provided. The display device includes an OLED display substrate and a packaging cover plate, wherein the display device further includes at least one final solid organic packaging layer made from a material including a component having an azobenzene group between the display substrate and the packaging cover plate.

Preferably, the display device further includes an inorganic packaging layer between the final solid organic packaging layer and the OLED display substrate.

REFERENCE SIGNS

Figure 1:
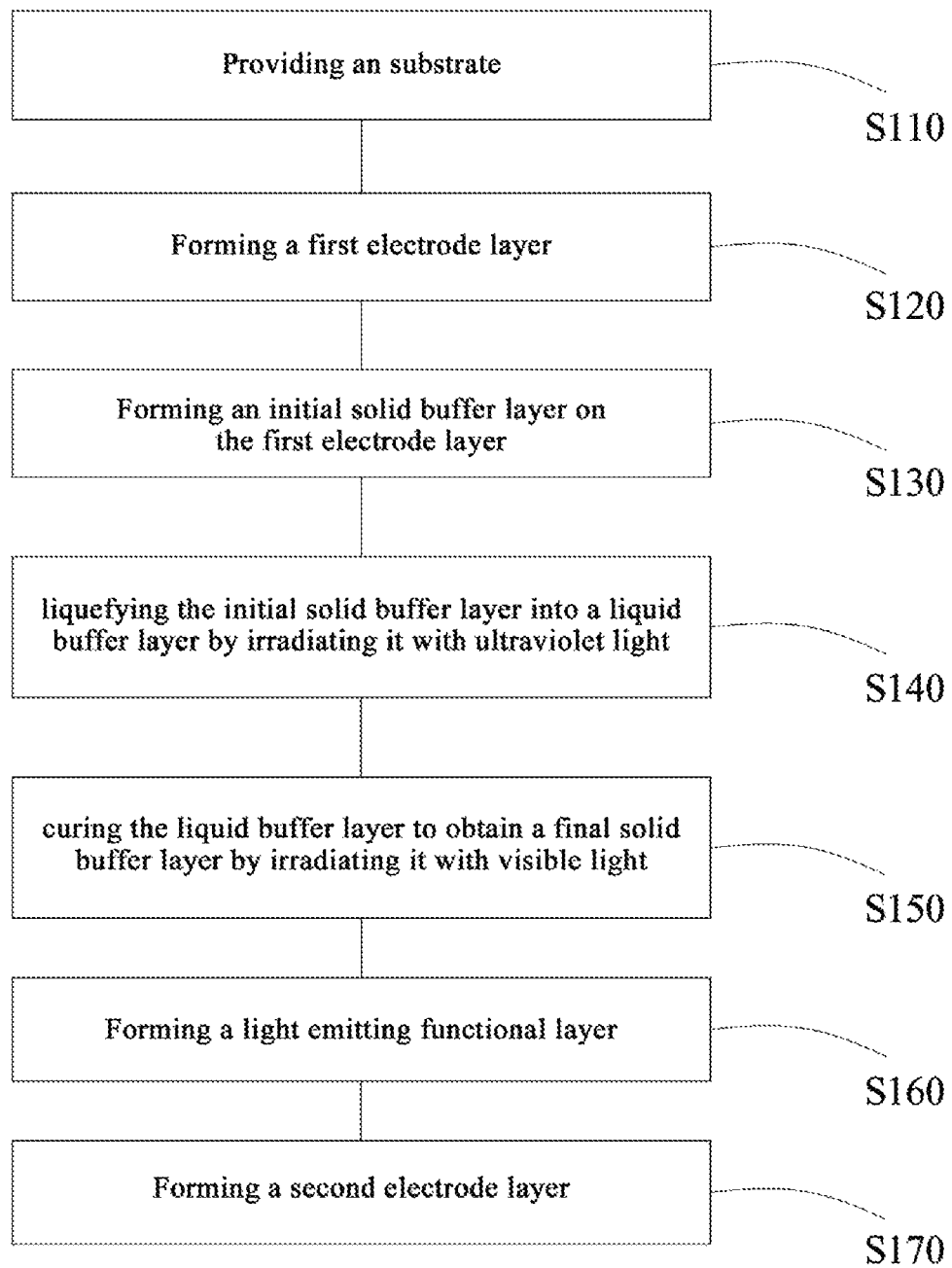
FIG. 1 is a flowchart of a method for manufacturing an OLED display substrate according to the present invention.

210, 510: substrate 220, 520: first electrode layer
230: final solid buffer layer 240, 530: light emitting functional layers
250, 540: second electrode layer 260, 550: inorganic packaging layer
270, 560: final solid organic packaging layer
280, 570: packaging cover plate

DETAILED DESCRIPTION OF THE EMBODIMENTS

The specific embodiments of the present disclosure will be described in detail below with reference to the accompanying drawings. It should be understood that the specific embodiments described herein are merely used for illustrating and explaining the present disclosure, rather than limiting the present disclosure.

In a first aspect, the present disclosure provides a method for manufacturing an OLED display substrate, as shown in FIG. 1, including:

step S110, providing an substrate;

step S120, forming a first electrode layer on the substrate;

step S130, forming an initial solid buffer layer with a material including a component having an azobenzene group on the first electrode layer, step S140, irradiating the initial solid buffer layer with ultraviolet light to liquefy the initial solid buffer layer into a liquid buffer layer;

step S150, irradiating the liquid buffer layer with visible light to cure the liquid buffer layer so as to obtain a final solid buffer layer, wherein the final solid buffer layer has a HOMO energy level between −6 eV and −4.5 eV and a LUMO energy level between −3 eV and −2 eV;

step S160, forming a light emitting functional layers on the final solid buffer layer; and step S170, forming a second electrode layer on the light emitting functional layers.

Since the material forming the initial solid buffer layer includes the component having the azobenzene group which has a thermodynamically stable trans-isomer and a metastable cis-isomer. Under the irradiation of ultraviolet light, the azobenzene group is converted from a trans-structure to a cis-structure, i.e. the buffer layer converting from a solid state into a liquid state. Conversely, under the irradiation of visible light, the azobenzene group returns to the trans-structure from the cis-structure, i.e. the buffer layer converting from the liquid state into the solid state.

In step S140, the liquid buffer layer formed by the irradiation of ultraviolet light flows on the surface of the first electrode material layer, thereby covering the protrusions, particles and the like on the surface of the first electrode material layer and filling the cracks, pits and the like on the surface of the first electrode material layer. That is to say, a planarization treatment is performed to the surface of the first electrode material layer by the liquid buffer layer.

In step S150, the liquid buffer layer is irradiated with visible light to make the thermodynamically metastable cis-structure convert into the trans-structure again, thereby obtaining the final solid buffer layer.

In the above method for manufacturing a display substrate, by the solid-liquid-solid conversion of the buffer layer, the planarization treatment to the surface of the first electrode material layer is accomplished, so that a subsequent light emitting functional layers can be formed on a flat surface and thus mura, short circuit and other defects are unlikely to be occur, thereby improving the yield of the display device.

In the present disclosure, the light emitting functional layer includes a hole transport layer, a light emitting layer and an electron transport layer stacked together.

As the final solid buffer layer has a HOMO energy level between −6 eV and −4.5 eV, and the LUMO energy level between −3 eV and −2 eV, the final solid buffer layer can be used as the hole transport layer. When a voltage is applied to the first electrode layer and the second electrode layer, holes can be transmitted in the final solid buffer layer and the hole transport layer, thereby ensuring normal light emitting of an OLED device.

In the present disclosure, the light emitting functional layer can be made by any method such as thermal evaporation, inkjet printing, coating or the like.

The first electrode layer can be made of a metal material and can also be made of a transparent electrode material (such as an ITO material). The second electrode layer can be made of a metal material and can also be made of a transparent electrode material. Generally, the first electrode layer is an anode layer, and the second electrode layer is a cathode layer. The OLED display substrate includes a plurality of pixel units, and each pixel unit has a first electrode.

The material forming the initial solid buffer layer can be a conductive material of azobenzene small molecule compounds or azobenzene polymers, or a blend of a non-conductive material of azobenzene small molecule compounds or azobenzene polymers and a conductive organic material. In the present disclosure, the material forming the initial solid buffer layer can be any material capable of achieving solid-liquid-solid conversion under illumination. As an embodiment, the material forming the initial solid buffer layer includes a component shown by the following formula I:

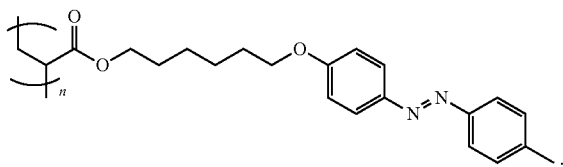

I

The material performs a transformation shown by the following formula under the irradiation of the visible light and the ultraviolet light:

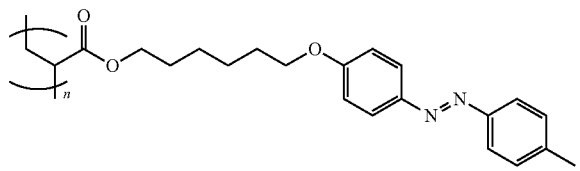

wherein the liquid buffer layer contains a component shown by the following formula II:

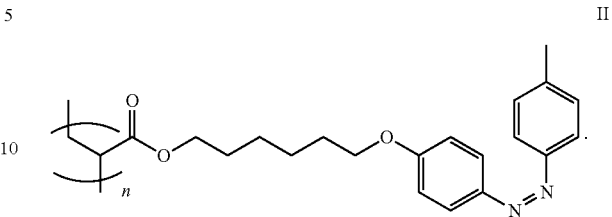

II

When the material forming the initial solid buffer layer includes the component shown by the above formula I, the ultraviolet light used has a wavelength of 360 nm to 400 nm, and the visible light used has a wavelength of 530 nm to 550 nm.

In the present disclosure, the substrate may include a transparent substrate and a TFT array formed on the transparent substrate.

Preferably, a buffer layer can also be disposed between the transparent substrate and the TFT array, and the buffer layer is made of a material having an azobenzene group. The buffer layer can be irradiated with the ultraviolet light so as to make it convert into liquid, therefore particles on the transparent substrate can be covered and pits and cracks on the transparent substrate can be filled by the liquid buffer layer. Thereafter, the liquid buffer layer is cured by irradiating with the visible light, and then the TFT array is formed on the cured buffer layer. The TFT array thus formed could avoid defects such as short circuit and the like.

Figure 2:
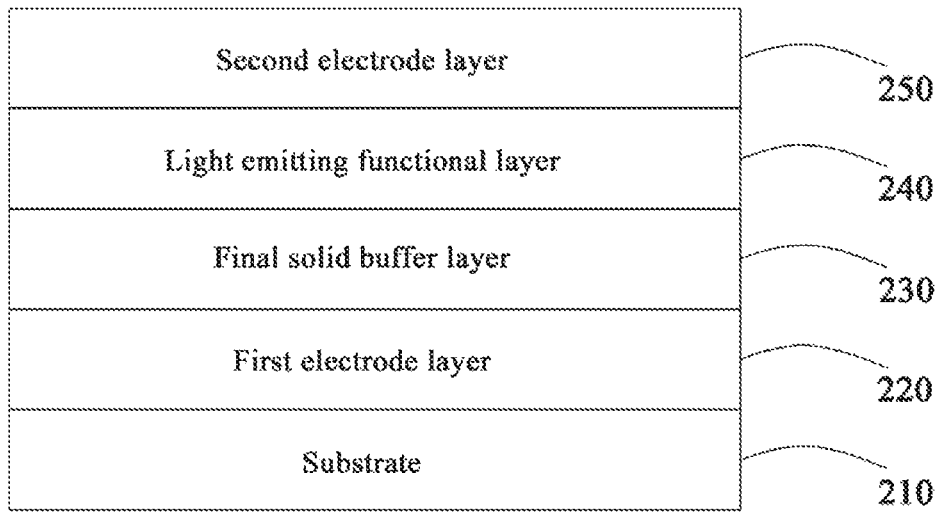
FIG. 2 is a structural schematic diagram of an OLED display substrate according to the present invention.

In a second aspect, the present disclosure provides an OLED display substrate manufactured by the above mentioned method according to the present disclosure. Specifically, as shown in FIG. 2, the OLED display substrate successively includes an substrate 210, a first electrode layer 220, a light emitting functional layer 240 and a second electrode layer 250, wherein the OLED display substrate further includes a final solid buffer layer 230 arranged between the light emitting functional layer 240 and the first electrode layer 220; the final solid buffer layer 230 includes a component having an azobenzene group; and the final solid buffer layer has a HOMO energy level between −6 eV and −4.5 eV and a LUMO energy level between −3 eV and −2 eV.

As mentioned above, the final solid buffer layer 230 includes a component shown by the following formula I:

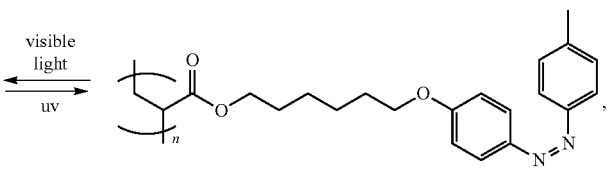

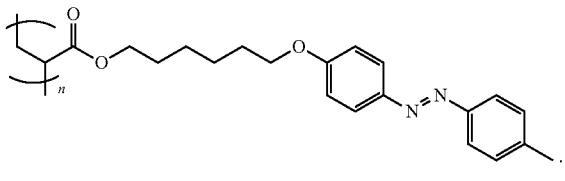

I

In a third aspect, the present invention provides a display device including the above-mentioned OLED display substrate according to the present disclosure and a packaging cover plate.

Figure 3:
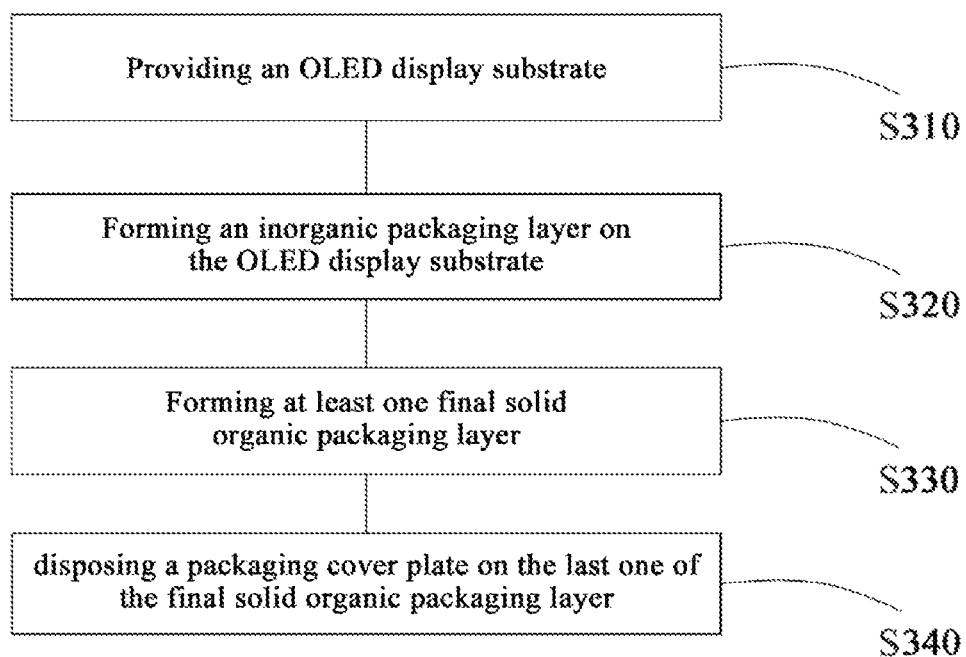
FIG. 3 is a structural schematic diagram of a display device according to the present invention.

In a fourth aspect, as shown in FIG. 3, the present invention provides a method for packaging a display device including:

step S310, providing an OLED display substrate;

step S330, forming at least one final solid organic packaging layer; and step S340, providing a packaging cover plate on the last one of the final solid organic packaging layer, wherein the step of forming at least one final solid organic packaging layer includes:

forming an initial solid organic packaging layer with a material including a component having an azobenzene group;

irradiating the initial solid organic packaging layer with ultraviolet light to liquefy the initial solid organic packaging layer into a liquid packaging layer; and irradiating the liquid packaging layer with visible light to cure the liquid packaging layer to obtain the final solid organic packaging layer.

In the present disclosure, the material forming the initial solid organic packaging layer can be any material capable of achieving solid-liquid-solid conversion under illumination; for example, the material forming the initial solid organic packaging layer may include a component shown by the following formula I:

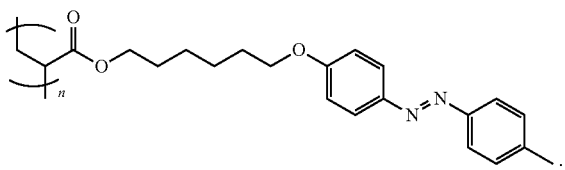

I

The material can generate the following structural transformation under the irradiation of the visible light and the ultraviolet light:

wherein the liquid buffer layer contains a component shown by the following formula II:

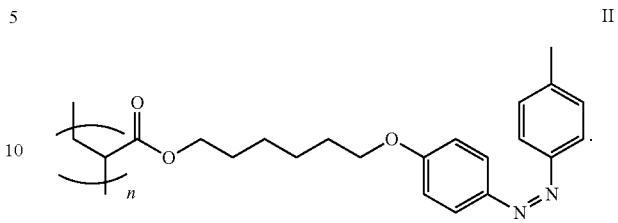

II

In the method for packaging a display device, the OLED display substrate in the display device can be provided by the above method for manufacturing the OLED display substrate.

As a preferred embodiment, the ultraviolet light has a wavelength of 360 nm to 400 nm, and the visible light for curing the liquid organic packaging layer has a wavelength of 530 nm to 550 nm.

It is easy to understand that, when multiple final solid organic packaging layers are provided, the multiple final solid organic packaging layers are stacked with each other.

In order to improve the sealing performance of the display device, preferably, the method for packaging further includes, between step S310 and step S330, a step S320:

forming an inorganic packaging layer on the OLED display substrate.

The inorganic packaging layer is arranged on the OLED display substrate, and all final solid organic packaging layers formed by a material including a component having an azobenzene group are arranged between the inorganic packaging layer and the packaging cover plate.

In the present disclosure, the material forming the inorganic packaging layer could be an oxide of silicon and/or a nitride of silicon, and the inorganic packaging layer could be obtained by a chemical vapor deposition method. In the present disclosure, there is no limit on how to form the initial solid organic packaging layer. Preferably, the initial solid organic packaging layer could be formed by thermal evaporation. For example, the inorganic packaging layer and the initial solid organic packaging layer could be separately formed in the same chamber. In the method for packaging according to the present disclosure, the initial solid organic packaging layer is formed on a solid film layer. The solid film layer may be the second electrode layer of the OLED display substrate or an inorganic packaging material layer formed on the OLED display substrate. Since the material forming the initial solid organic packaging layer comprises the material having an azobenzene group, it has thermodynamically stable trans-isomer and metastable cis-isomer. Under the irradiation of ultraviolet light, the azobenzene group undergoes transition from a trans-state to a cis-state, i.e. the solid organic packaging layer converting into the

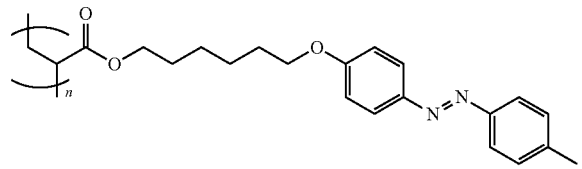 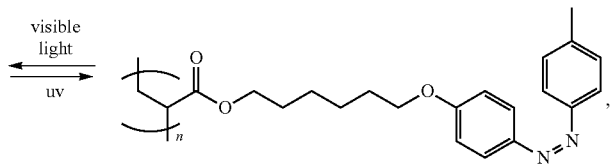

liquid organic packaging layer. The liquid organic packaging layer flows on the surface of the solid film layer so as to fill the micro pores on the solid film layer, cover the particles on the solid film layer, and release the stress of the solid film layer during the flow. Then, the liquid organic packaging layer is cured into the final solid organic packaging layer by irradiating with visible light. Since the stress of the solid film layer has been released in the step S330, the display device obtained by the method for packaging according to the present disclosure does not suffer from cracking of the solid film layer due to stress which will result in an air leakage phenomenon of the display device, and thus the service life of the display device is prolonged.

In a fifth aspect, the present disclosure provides a display device including an OLED display substrate and a packaging cover plate 570, wherein the display device further includes at least one final solid organic packaging layer 560 arranged between the OLED display substrate and the packaging cover plate 570, and the final solid organic packaging layer 560 is made of a material including a component having an azobenzene group.

Preferably, the display device further includes an inorganic packaging layer 550 between the final solid organic packaging layer 560 and the OLED display substrate. By providing the inorganic packaging layer 550, the sealing performance can be further improved, and thus the service life of the OLED display substrate is prolonged.

Figure 4:
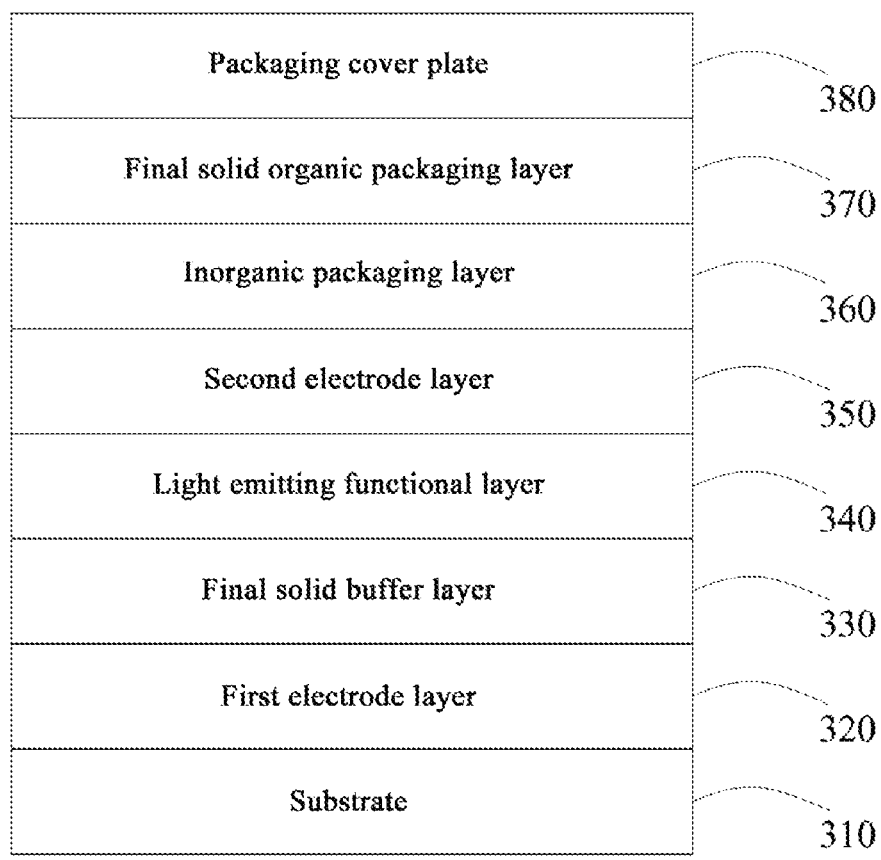
FIG. 4 is a flowchart of a packaging method according to the present invention.
Figure 5:
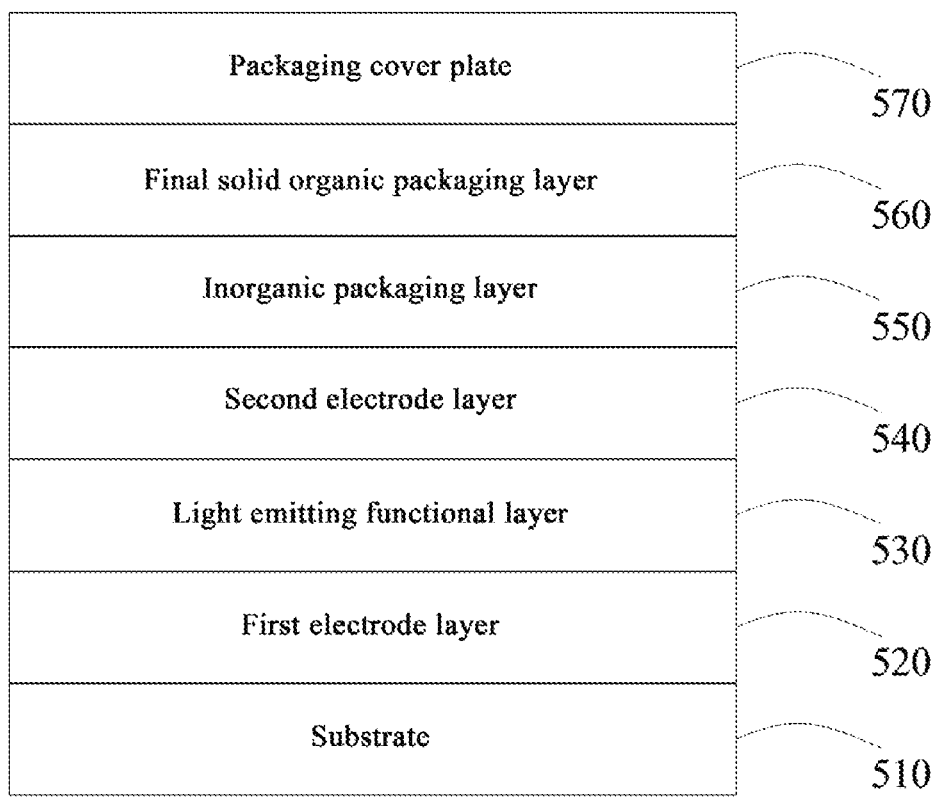
FIG. 5 is a structural schematic diagram of another display device according to the present invention.

The OLED display substrate in the display device can be the display substrate having the final solid buffer layer produced by the method of the present disclosure or a conventional display substrate. For example, in the specific embodiment as shown in FIG. 4, the OLED display substrate includes an substrate 310, a first electrode layer 320, a final solid buffer layer 330, a light emitting layer 340 and a second electrode layer 350; in the specific embodiment as shown in FIG. 5, the OLED display substrate includes an substrate 510, a first electrode layer 520, a light emitting layer 530 and a second electrode layer 540.

It can be understood that the above embodiments are merely exemplary embodiments employed to explain the principles of the present disclosure, but the present disclosure is not limited thereto. For those of ordinary skill in the art, various modifications and improvements can be made without departing from the spirit and essence of the present disclosure, and these modifications and improvements are also encompassed within the protection scope of the present disclosure.

The invention claimed is:

1. A method for manufacturing an OLED display substrate, comprising:
providing an substrate;
forming a first electrode layer on the substrate;
forming an initial solid buffer layer with a material including a component having an azobenzene group on the first electrode layer;
liquefying the initial solid buffer layer into a liquid buffer layer by irradiating it with ultraviolet light;
curing the liquid buffer layer to obtain a final solid buffer layer by irradiating it with visible light, wherein the final solid buffer layer has a HOMO energy level between −6 eV and −4.5 eV and a LUMO energy level between −3 eV and −2 eV;
forming a light emitting functional layer on the final solid buffer layer; and
forming a second electrode layer on the light emitting functional layer.

2. The method for manufacturing an OLED display substrate according to claim 1, wherein the material forming the initial solid buffer layer comprises a component shown by the following formula I:

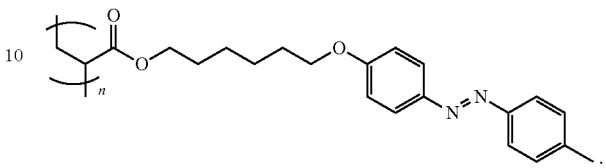

I

3. The method for manufacturing an OLED display substrate according to claim 2, wherein the visible light has a wavelength of 530 nm to 550 nm.

4. The method for manufacturing an OLED display substrate according to claim 2, wherein the ultraviolet light has a wavelength of 360 nm to 400 nm.

5. A method for packaging a display device, comprising:
providing an OLED display substrate;
forming at least one final solid organic packaging layer; and
providing a packaging cover plate on the last one of the final solid organic packaging layer,
wherein the step of forming the final solid organic packaging layer comprises:
forming an initial solid organic packaging layer with a material including a component having an azobenzene group;
liquefying the initial solid organic packaging layer into a liquid organic packaging layer by irradiating it with ultraviolet light; and
curing the liquid packaging organic layer to obtain the final solid organic packaging layer by irradiating it with visible light.

6. The method for packaging a display device according to claim 5, wherein the material forming the initial solid organic packaging layer comprises a component shown by the following formula I:

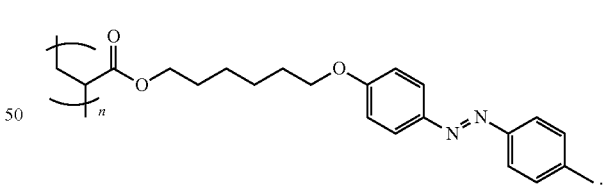

I

7. The method for packaging a display device according to claim 5, wherein the step of providing the OLED display substrate comprises:
providing an substrate;
forming a first electrode layer on the substrate;
forming an initial solid buffer layer with a material including a component having an azobenzene group on the first electrode layer;
liquefying the initial solid buffer layer into a liquid buffer layer by irradiating it with ultraviolet light;
curing the liquid buffer layer to obtain a final solid buffer layer by irradiating it with visible light, wherein the final solid buffer layer has a HOMO energy level between −6 eV and −4.5 eV and a LUMO energy level between −3 eV and −2 eV;

forming a light emitting functional layer on the final solid buffer layer; and forming a second electrode layer on the light emitting functional layer.

8. The method for packaging a display device according to claim 5, wherein the packaging method further comprises, between the step of providing the OLED display substrate and the step of forming at least one final solid organic packaging layer, the following step:

forming an inorganic packaging layer on the OLED display substrate.

9. The method for packaging a display device according to claim 6, wherein the visible light has a wavelength of 530 nm to 550 nm.

10. The method for packaging a display device according to claim 6, wherein the ultraviolet light has a wavelength of 360 nm to 400 nm.

11. An OLED display substrate comprising an substrate, a first electrode layer, a light emitting functional layer and a second electrode layer successively, wherein the OLED display substrate further comprises a final solid buffer layer between the light emitting functional layer and the first electrode layer;

the final solid buffer layer is formed by a material comprising a component having an azobenzene group; and the final solid buffer layer has a HOMO energy level between −6 eV and −4.5 eV and a LUMO energy level between −3 eV and −2 eV.

12. The OLED display substrate according to claim 11, wherein the material forming the final solid buffer layer comprises a component shown by the following formula I:

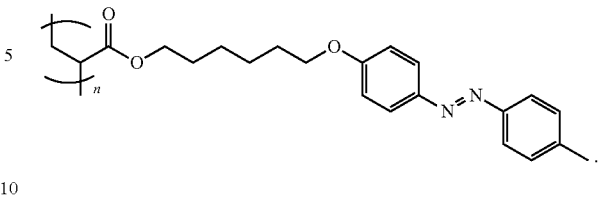

13. A display device, comprising an OLED display substrate according to claim 11 and a packaging cover plate.

14. The display device according to claim 13, wherein the display device further comprises an inorganic packaging layer, a packaging cover plate and at least one final solid organic packaging layer, the inorganic packaging layer is arranged on the OLED display substrate, all final solid organic packaging layers are arranged between the inorganic packaging layer and the packaging cover plate, and the final solid organic packaging layer is formed by a material comprising a component having an azobenzene group.

15. A display device obtained by the packaging method according to claim 5, comprising an OLED display substrate and a packaging cover plate, wherein the display device further comprises at least one final solid organic packaging layer, the final solid organic packaging layer is arranged between the OLED display substrate and the packaging cover plate, and the final solid organic packaging layer is formed by a material comprising a component having an azobenzene group.

16. The display device according to claim 15, wherein the display device further comprises an inorganic packaging layer arranged between the final solid organic packaging layer and the OLED display substrate.

\* \* \* \* \*